(12) United States Patent
Striflier

(10) Patent No.: US 7,714,658 B1
(45) Date of Patent: May 11, 2010

(54) METHOD AND SYSTEM FOR VARIABLE-GAIN AMPLIFIER

(75) Inventor: Walter Andrew Striflier, Sunnyvale, CA (US)

(73) Assignee: Linear Technology Corporation, Milpitas, CA (US)

( * ) Notice: Subject to any disclaimer, the term of this patent is extended or adjusted under 35 U.S.C. 154(b) by 26 days.

(21) Appl. No.: 12/276,552

(22) Filed: Nov. 24, 2008

(51) Int. Cl.
*H03G 3/00* (2006.01)

(52) U.S. Cl. .................. 330/284; 330/254; 330/149; 330/302

(58) Field of Classification Search .......... 330/284, 330/254, 149, 302
See application file for complete search history.

(56) References Cited

U.S. PATENT DOCUMENTS

| | | | |
|---|---|---|---|
| 3,609,567 A * | 9/1971 | Webb et al. ............ | 327/552 |
| 3,919,685 A * | 11/1975 | Haill ...................... | 367/65 |
| 4,112,384 A * | 9/1978 | Buchberger .......... | 330/141 |
| 5,325,728 A * | 7/1994 | Zimmerman et al. .. | 73/861.12 |
| 5,684,431 A * | 11/1997 | Gilbert et al. .......... | 330/254 |
| 6,405,164 B1 * | 6/2002 | Pinai ...................... | 704/225 |
| 6,545,622 B1 * | 4/2003 | Kamal et al. .......... | 341/144 |
| 2010/0007419 A1 * | 1/2010 | Gilbert ................... | 330/254 |

* cited by examiner

*Primary Examiner*—Patricia Nguyen
(74) *Attorney, Agent, or Firm*—McDermott Will & Emery LLP

(57) ABSTRACT

Method for a variable-gain amplifier (VGA). A plurality of attenuator nodes is serially connected via a first set of resistors between adjacent attenuator nodes to form an attenuator ladder and coupled to an AC input of the variable-gain amplifier. Each of the attenuator nodes includes a transistor and an RC circuitry that couples drain, gate, and source terminals of the transistor to a control signal for the attenuator node. The VGA also includes an amplifier that has an output produced based on an input to the amplifier connected to a plurality of coupled terminals, each of which is respectively from one of the plurality of attenuator nodes. The RC circuitry for each attenuator node is configured to pass a control signal to the gate terminal of the transistor of the attenuator node in accordance with a first time scale and permit the gate terminal to float in accordance with a second time scale so as to yield a reduction of distortion contributed by the transistor while the transistor is transitioning between on and off states.

28 Claims, 9 Drawing Sheets

METHOD AND SYSTEM FOR VARIABLE-GAIN AMPLIFIER

BACKGROUND

1. Field of Invention

The present teachings presented herein relate to a variable-gain amplifier. More specifically, the present teachings relate to methods and systems for improved variable-gain amplifier employing a tapped-attenuator ladder.

2. Discussion of Related Art

A variable gain amplifier (VGA) is used in a wide variety of communication system applications. In most applications, it is necessary for the VGA to maintain good dynamic range across the full gain control range. Other desirable characteristics of a VGA include high linearity, linear-in-dB gain control, low noise, low DC power consumption, CMOS compatibility, high frequency operation, large signal handling capability, and a gain control relation that is insensitive to ambient temperature.

VGA's have been used for many years, and a variety of techniques have been employed to achieve this critical circuit function. The types of VGA's reported in the literature generally fall into several broad categories. Current steering is an abundant method that usually employs some type of emitter-coupled bipolar junction transistor (BJT) pair to steer a fraction of current based on a ΔVbe control voltage. The bias control method alters the bias point of a transistor device to affect gm and the resulting gain. PIN diodes or MOSFET resistors are often used to degenerate the gain of amplifiers in a continuously variable fashion. Another method relies on a class of circuits known as multi-Tanh cells to affect the gain of a gm block. Although simple to implement, these four general methods to realize a VGA often suffer from poor linearity and small input signal handling capability.

One approach to address some of the short-comings of conventional VGAs is disclosed in U.S. Pat. No. 5,077,541 by Gilbert, entitled "Variable-Gain Amplifier Controlled by an Analog Signal and Having a Large Dynamic Range," issued Dec. 31, 1991. This patent describes a variable-gain amplifier employing a fixed resistive attenuator ladder with a plurality of high impedance tap points to sample the signal at each of the attenuator nodes. The signal voltage at these tap points are converted to signal currents that are summed into an operational amplifier to create a composite gain function. The effective transconductance gain of each tap point is varied in the specified method to produce a continuous gain function. The fixed attenuator ladder aims at providing a stable input impedance with large input signal handling capability across the entire linear-in-dB gain range.

Although Gilbert method of signal tapping and gain interpolation control may be attractive in bipolar technology, it is less desirable in CMOS technology. Implementing the gm taps in CMOS is prone to upconverted 1/f noise due to the nature of current-carrying MOS transistors, and the gm errors are substantially greater due to the poor MOSFET Vth matching compared to BJT Vbe matching.

A CMOS-compatible, attenuator-based VGA is disclosed in U.S. Pat. No. 7,205,817 by Huang, entitled "Analog Control Integrated FET Based Variable Attenuator," issued Apr. 17, 2007. This patent describes a method of assembling and controlling a plurality of series and parallel MOS devices to implement a variable attenuator. Huang avoids critical Vth matching issues and eliminates DC bias currents within the attenuator, but it involves controlling both the series and parallel elements along the attenuator ladder. This yields a more difficult control circuit that often results in a gain-control function with significantly bumpy deviations from the ideal linear-in-dB gain law. Controlling distortion throughout the gain control range is also difficult and requires floating P-wells of a sort not typically found in a standard N-well CMOS process.

SUMMARY

An improved variable-gain amplifier (VGA) is disclosed. According to one aspect of the present teaching, an improved VGA includes a plurality of attenuator nodes serially connected via a first set of resistors between adjacent attenuator nodes to form an attenuator ladder and coupled to an AC input of the variable-gain amplifier. Each attenuator node comprises a transistor and an RC circuitry that couples drain, gate, and source terminals of the transistor to a control signal for the attenuator node. The improved VGA further includes an amplifier having an output produced based on an input to the amplifier connected to a plurality of coupled terminals, each of which is respectively from one of the plurality of attenuator nodes. In this improved VGA, the RC circuitry for each attenuator node is configured to pass a control signal to the gate terminal of the transistor of the attenuator node in accordance with a first time scale and permit the gate terminal to float in accordance with a second time scale so as to yield a reduction of distortion contributed by the transistor while the transistor is transitioning between on and off states. The term "float" denotes the effect whereby the AC gate voltage follows a weighted average of the source and drain AC voltages.

According to a different aspect of the present teaching, an improved VGA a plurality of attenuator nodes serially connected via a first set of resistors between adjacent attenuator nodes to form an attenuator ladder and coupled to an AC input of the variable-gain amplifier. Each attenuator node comprises a first transistor, an RC circuitry that couples drain, gate, and source terminals of the first transistor to a control signal for the attenuator node, and an RC enabling circuitry. The improved VGA also includes an amplifier having an output produced based on an input of the amplifier connected to a plurality of coupled terminals, each of which is respectively from one of the plurality of attenuator nodes. In the improved VGA according to this aspect of the present teaching, the RC circuitry for each attenuator node passes a first control signal to the gate terminal of the first transistor of the attenuator node in accordance with a first time scale and permits the gate terminal to float in accordance with a second time scale so as to yield a reduction of distortion contributed by the first transistor while the first transistor is transitioning between on and off states. In addition, the RC enabling circuitry of each attenuator node is capable of decoupling the RC circuitry when operating so as to minimize loading to the input to the amplifier.

According to another aspect of the present teaching, an improved VGA comprises a plurality of attenuator nodes serially connected via a first set of resistors between adjacent attenuator nodes to form an attenuator ladder and coupled to an AC input of the variable-gain amplifier, wherein each of the attenuator node comprises a first transistor and an RC circuitry that couples drain, gate, and source terminals of the first transistor to a control signal for the attenuator node. The improved VGA also includes an amplifier having an output produced based on an input of the amplifier connected to a plurality of coupled terminals, each of which is respectively from one of the plurality of attenuator nodes. The RC circuitry for each attenuator node passes a first control signal to the gate terminal of the first transistor of the attenuator node in accordance with a first time scale and permits the gate terminal to float in accordance with a second time scale so as to yield a reduction of distortion contributed by the first transistor while the first transistor is transitioning between on and off states. The improved VGA further have at least some attenuator nodes at the early stages of the attenuator ladder that include a gate clamping circuitry therein, each gate clamping circuitry having three terminals connecting to the gate of the first transistor, a second control signal, and a ground, respectively.

The present teaching also discloses an improved differential variable-gain amplifier (DVGA). The improved DVGA comprises a first set of attenuator nodes serially connected via a first set of resistors between adjacent first set of attenuator nodes to form a first attenuator ladder and coupled to a first AC input of the DVGA and a first amplifier having a first output produced based on an input of the first amplifier connected to a first plurality of coupled terminals, each of which is respectively from one of the first set of attenuator nodes. The improved DVGA also comprises a second set of attenuator nodes serially connected via a second set of resistors between adjacent second set of attenuator nodes to form a second attenuator ladder and coupled to a second AC input of the DVGA and a second amplifier having a second output produced based on an input of the second amplifier connected to a second plurality of coupled terminals, each of which is respectively from one of the second set of attenuator nodes. Each of the first and second sets of attenuator nodes comprises a transistor and an RC circuitry that couples drain, gate, and source terminals of the transistor to a control signal for the attenuator node. The RC circuitry for each attenuator node is configured to pass a control signal to the gate terminal of the transistor of the attenuator node in accordance with a first time scale and permit the gate terminal to float in accordance with a second time scale so as to yield a reduction of distortion contributed by the transistor while the transistor is transitioning between on and off states.

BRIEF DESCRIPTION OF THE DRAWINGS

The teachings claimed and/or described herein are further described in terms of exemplary embodiments. These exemplary embodiments are described in detail with reference to the drawings. These embodiments are non-limiting exemplary embodiments, in which like reference numerals represent similar structures throughout the several views of the drawings, and wherein:

DETAILED DESCRIPTION

The present teaching discloses improved VGA. The exemplary implementations described herein include an N-well CMOS process with a threshold of 0.7 Volts for NMOSFET, i.e., Vth=0.7V, operating with a single 3V supply. The exemplary attenuator circuits illustrated herein employ a 50-Ohm, single-ended, ground referenced, five-node attenuator ladder with 4 dB of attenuation per stage. These exemplary embodiments are intended to simplify and clarify the detailed descriptions contained herein and are not intended to limit the scope of the present teaching.

Figure 1:
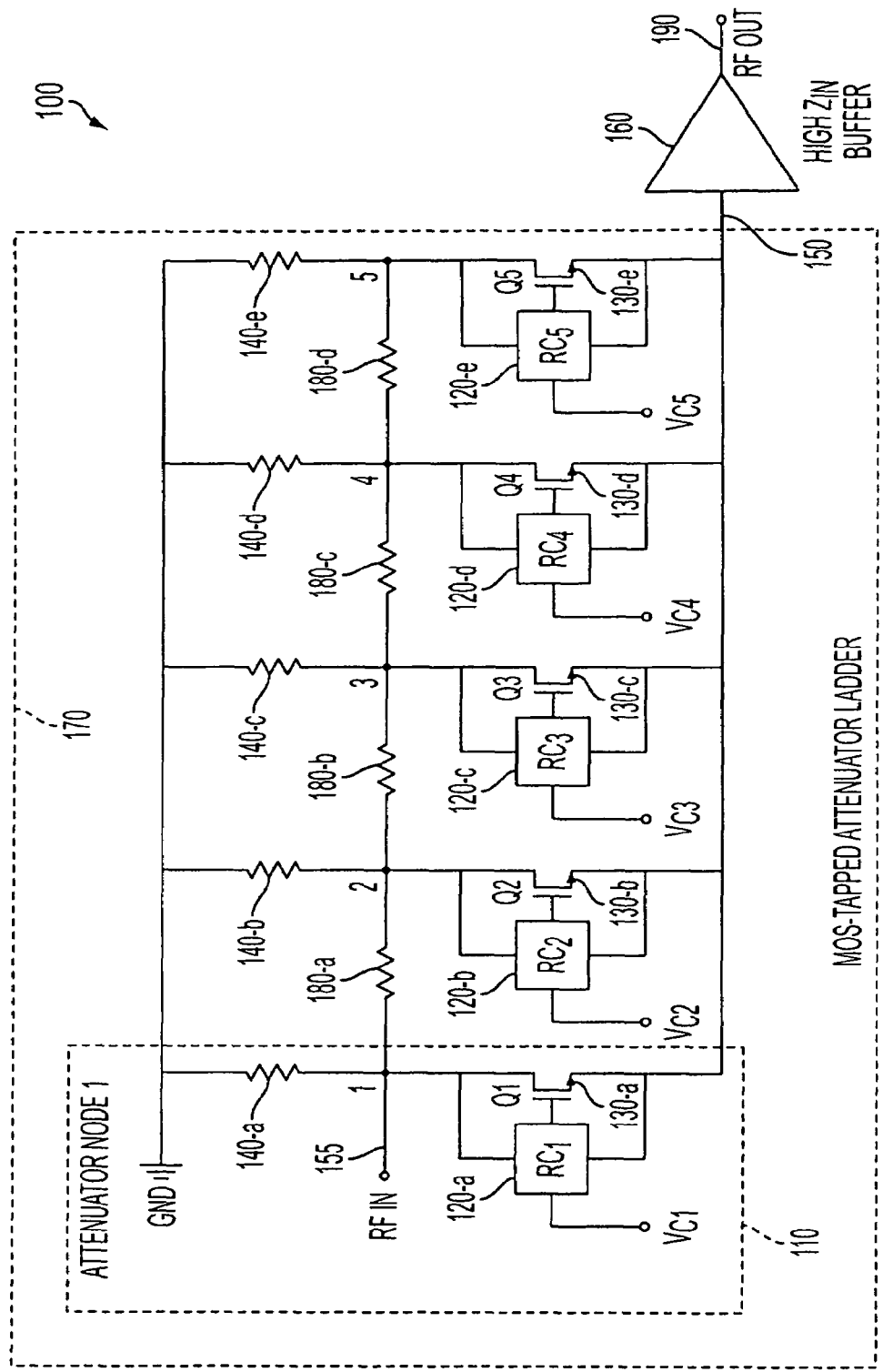
FIG. 1 depicts an exemplary VGA circuit employing NMOS tap transistors, each with a generalized RC network coupling the drain, gate, and source of the FET device to a control signal, according to an embodiment of the present teaching.

FIG. 1 depicts an exemplary VGA circuit 100 comprising a serially connected attenuator ladder 170 and an amplifier 160, according to an embodiment of the present teaching. The attenuator ladder 170 generally comprises a plurality of attenuator nodes that are serially connected. In this illustrative embodiment, the attenuator ladder comprises five serially connected attenuator nodes and one of which, i.e., 110, is identified in FIG. 1 and all others are similarly constructed. In this exemplary embodiment, each of the attenuator node employs an NMOS tap transistor, e.g., Q1 130-a, Q2 130-b, Q3 130-c, Q4 130-d, and Q5 130-e a generalized RC network, e.g., 120-a, 120-b, 120-c, 120-d, and 120-e, coupling the drain, gate, and source of the FET device to a control signal, e.g., $V_{c1}$, $V_{c2}$, $V_{c3}$, $V_{c4}$, $V_{c5}$, respectively. Different attenuator nodes are serially connected at the source terminals of the tap transistors via a set of resistors, e.g., 180-a, 180-b, 180-c, and 180-d and together they are coupled to an input 155 of the VGA 100. The sources of the tap transistors also individually connect to the ground via their respective resistors, e.g., 140-a, 140-b, 140-c, 140-d, and 140-e. In the exemplary embodiment shown in FIG. 1, the drains of all the tap transistors are coupled together to the input 150 of the amplifier 160, which produces an output 190 of the VGA 100.

In general, the tap transistors and RC networks for each attenuator node can be tailored separately. In some embodiments, such as the one shown herein, identical NMOS transistors and RC networks are employed for all stages of attenuator nodes.

In operation, when a control signal is used to tap on a single attenuator node, the attenuator circuit behaves in accordance with the principles of a common digital attenuator. In this case, the tapped transistor is switched ON when a sufficiently positive voltage is supplied to the gate of the NMOS transistor. To keep all other remaining transistors switched OFF, a sufficiently low control voltage can be supplied to the gate terminals of these transistors. In this exemplary situation, the voltage gain to the amplifier 160 (or high $Z_{IN}$ buffer) is the corresponding attenuation to the tapped attenuator node.

When two or more adjacent attenuator nodes are tapped using their corresponding control signals, the behavior of the VGA circuit 100 is more complex. In this case, the input to the amplifier 160 from the coupled drain of the tapped attenuator nodes is a weighted sum of these multiple attenuator nodes. In addition, the transistor conduction also produces undesirable loading and distortion to the attenuator ladder. Some loading effects may be inevitable for this type of passive NMOS signal tapping. However, the loading effects are generally negligible when no more than two adjacent tap transistors are conducting at any given time and the attenuator step size between adjacent nodes is less than approximately 6 dB.

Besides the loading effects, when two or more adjacent attenuator nodes are tapped, the attenuator nodes may also produce distortion effects. This includes intermodulation distortion and harmonic distortion. It is known that such distortion effects are more difficult to suppress. While the distortion of a completely ON or completely OFF transistor is usually negligible, a partially conducting transistor, particularly when it is near its threshold voltage, may create pronounced distortion products, often 30-50 dB higher than that when it is at a purely ON or OFF state. Extensive computer simulations reveal that although these distortion cannot be eliminated, they can be substantially suppressed when an appropriate control sequence is applied to a properly designed VGA circuit.

A control sequence refers to a series of control signals used to tap the transistors in each attenuator node along the attenuator ladder. In the illustrative embodiment, such a control sequence corresponds to $V_{c1}, V_{c2}, V_{c3}, V_{c4}, V_{c5}$.

In some embodiments, a preferred control sequence is such that it aims at always keeping one FET device completely ON whenever an adjacent FET device is transitioning through its threshold region. Here, a transition includes both the transition from an OFF state to an ON state and the transition from an ON state to an OFF state. For example, between Q1 and Q2, either keep Q1 ON while Q2 is transitioning from OFF to ON state or keep Q2 ON while Q1 is transitioning from ON state to OFF state. This is so called two-step transition. It is found that this provides a maximum parallel resistive loading to the transitioning FET and has an effect of reducing distortion products when a transistor in an attenuator is near its threshold, i.e., going through a transition. The two-step transition can be applied in a consecutive manner along the attenuator ladder. For example, attenuator node #1 can be kept on while attenuator node #2 is transitioning from OFF to ON state. Then attenuator node #2 can be kept on while attenuator node #1 is transitioning from ON state to OFF state. Attenuator node #2 is kept on while attenuator node #3 is transitioning from OFF to ON state, etc.

Figure 4:
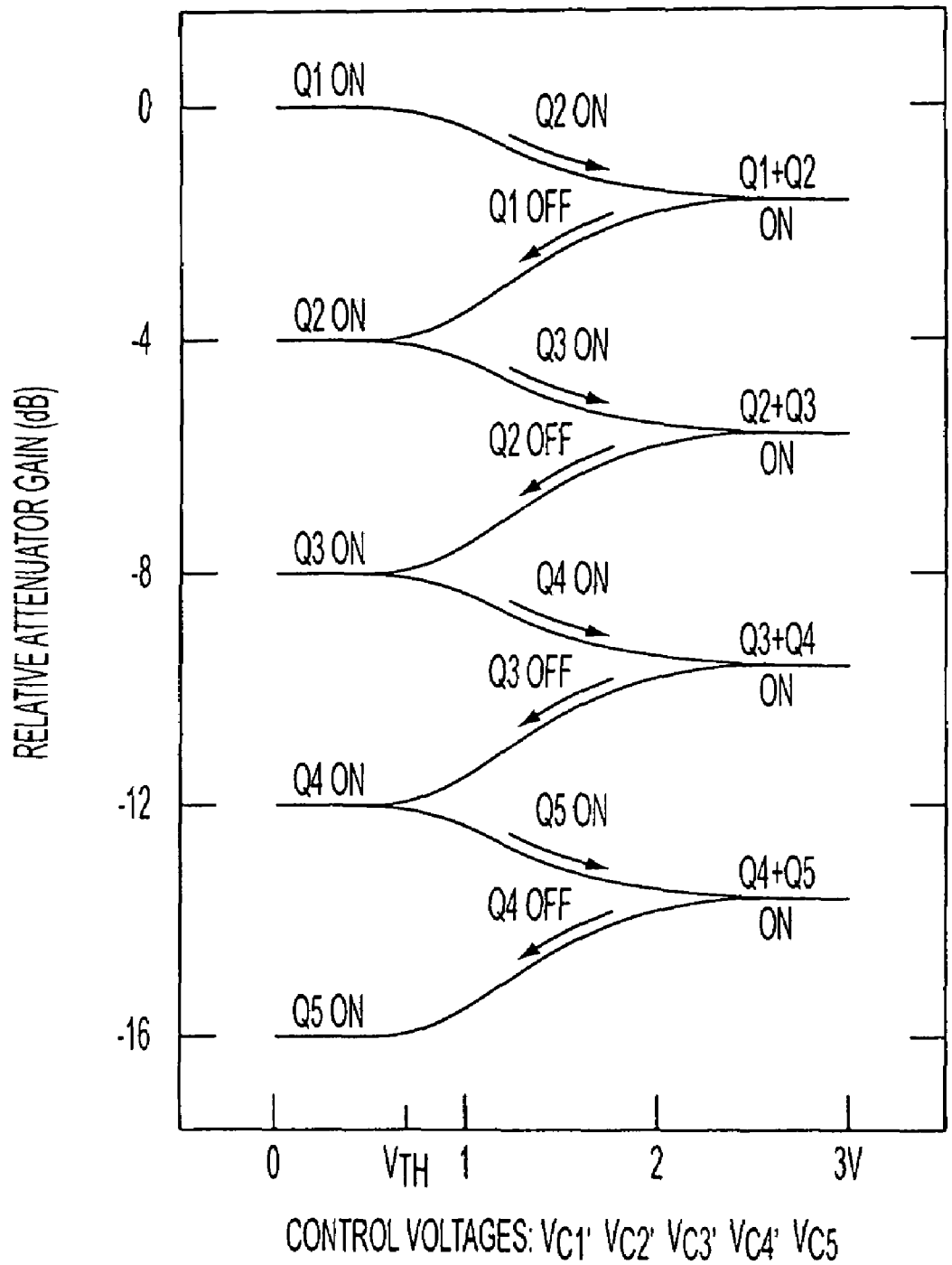
FIG. 4 illustrates an exemplary sequence of transitions through a 5-node attenuator ladder to achieve a gain control range of 16 dB, according to an embodiment of the present teaching.

Using such a control sequence, at any point along the gain control sequence, two transistors are made active, i.e., either in an ON state or in a transition, in order to control the effective attenuation of the tapped stages. Other transistors or stages are accordingly made inactive or OFF. To enable this, the sequence of control signals, i.e., $V_{c1}, V_{c2}, V_{c3}, V_{c4}, V_{c5}$, are supplied to transistors Q1, Q2, Q3, Q4, and Q5 (130-*a*, . . . , 130-*e*) in such a way so that at any given time, only two transistors in adjacent attenuator nodes are active. To ensure that the NMOS transistors in other attenuator nodes are inactive, a low control signal can be applied to these NMOS transistors so that they are completely OFF. FIG. 4 shows one exemplary control sequence and will be discussed in detail in reference to FIG. 4.

In FIG. 1, the RC circuit passes a corresponding control signal to the gate of an NMOS transistor. In some embodiments, to reduce the distortion, as discussed herein, the RC circuit is designed in such a way that the control signal is passed to the gate terminal of the transistor on a time scale greater than 10 AC cycles and, at the same time, floats the gate on a much shorter time scale such as less than one AC cycle. It has been found that this creates an effect of substantially reducing the intermodulation and harmonic distortion contribution of the transistor that is near its threshold. While the basic effect of a reduced distortion is generally observed and quite robust, circuit design for such an RC network may depend on various application requirements such as the signal frequency, control speed, attenuator impedance, and buffer impedance.

Figure 2:
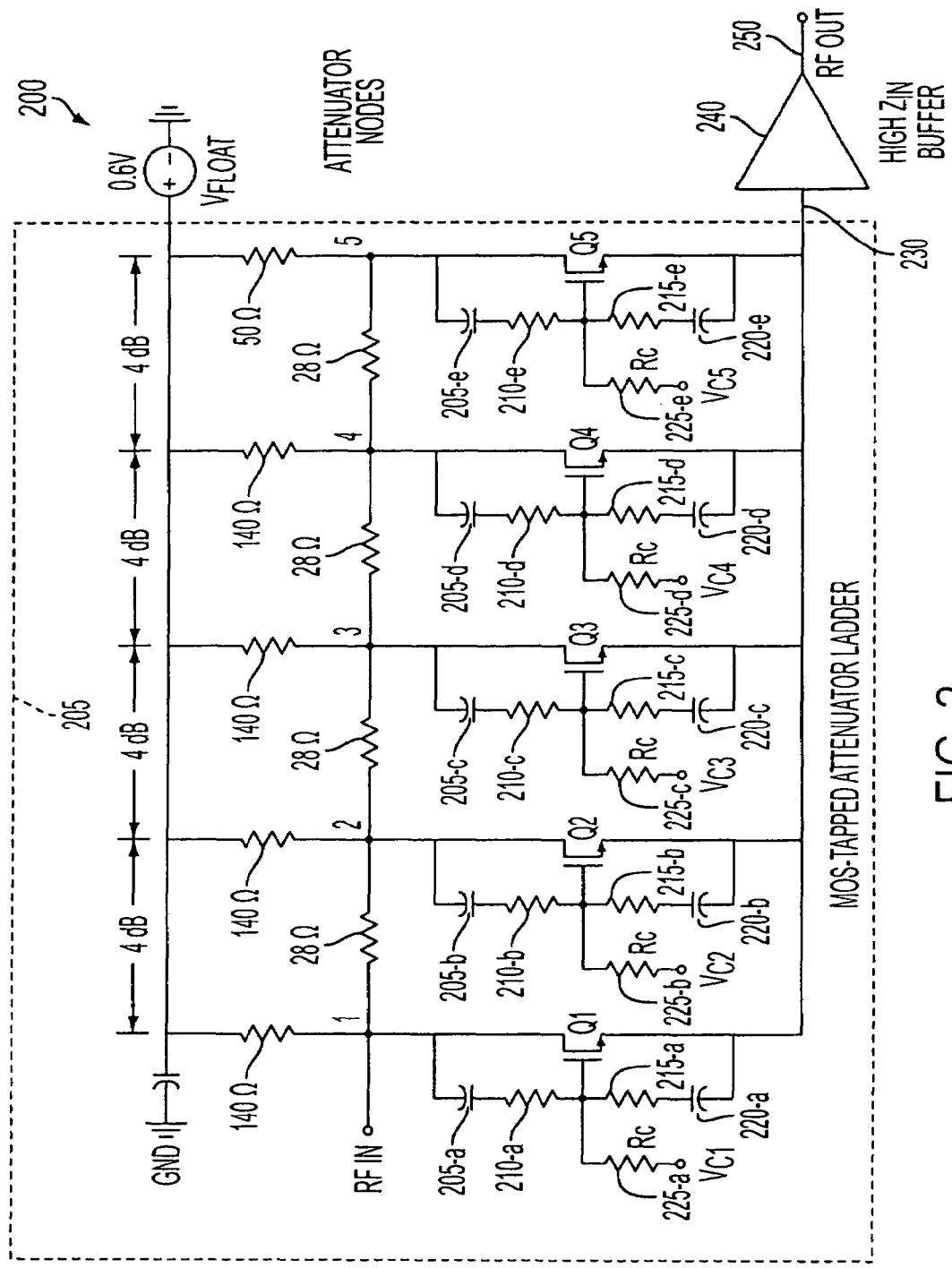
FIG. 2. depicts an exemplary VGA circuitry using a simple high-pass RC network, according to an embodiment of the present teaching.

One exemplary embodiment of a VGA 200 in accordance with the present teaching incorporating a detailed RC circuit design is depicted in FIG. 2. The illustrated VGA circuit 200 has a similar construct as the VGA 100 and includes an attenuator ladder 205 having 5 attenuator nodes and an amplifier 240. Similarly situated components in this exemplary embodiment are not separately labeled. As seen, the attenuator ladder 205 is constructed with a characteristic impedance of 50 Ohms and a step size of 4 dB between adjacent nodes. Other resistors via which the source of each attenuator node connects to the ground is around 140 Ohms. The resistors via which multiple attenuator nodes connects in a serial fashion are 28 Ohm resistors. A set of five identical NMOS tap transistors couple each of the attenuator nodes to a common node that feeds to the input of the high $Z_{IN}$ buffer amplifier 240. For designs requiring minimum noise level, the NMOS tap transistors are constructed and sized to an ON resistance that is less than one-tenth of the attenuator ladder impedance, approximately 2-4 Ohms in this case.

In FIG. 2, a high pass series RC circuit is employed as an implementation of the RC circuit in FIG. 1. In this illustration, each RC circuit includes an $R_c$ resistor 225-*a* passing a control signal to the gate of a corresponding NMOS transistor and two RC branches. The top RC branch connects the gate and source and the gate of the tap transistor. Specifically, the top RC branch include a resistor 210-*a* connected to the gate of a tap transistor and then serially connected to a capacitor 205-*a*, which is coupled to the source of the tap transistor. The bottom RC branch connects the gate and the drain of the tap transistor. Specifically, the bottom RC branch include a resistor 215-*a* connected to the gate of a tap transistor and then serially connected to a capacitor 220-*a*, which is coupled to the drain of the tap transistor. The resistance of the series RC branch is selected to minimally load the attenuator ladder and provide an appropriate time constant to allow the gate terminal to float on a time scale of a single AC cycle. The $R_c$ of each tapping stage is chosen to be large enough to allow sufficient gate floating but small enough to respond quickly to changes in the control voltage passed to the gate. The value of $R_c$ is a design choice, which is an inherent design trade-off. The ratio of component values in the two series RC branches are determined empirically from circuit simulation and optimization.

Figure 3:
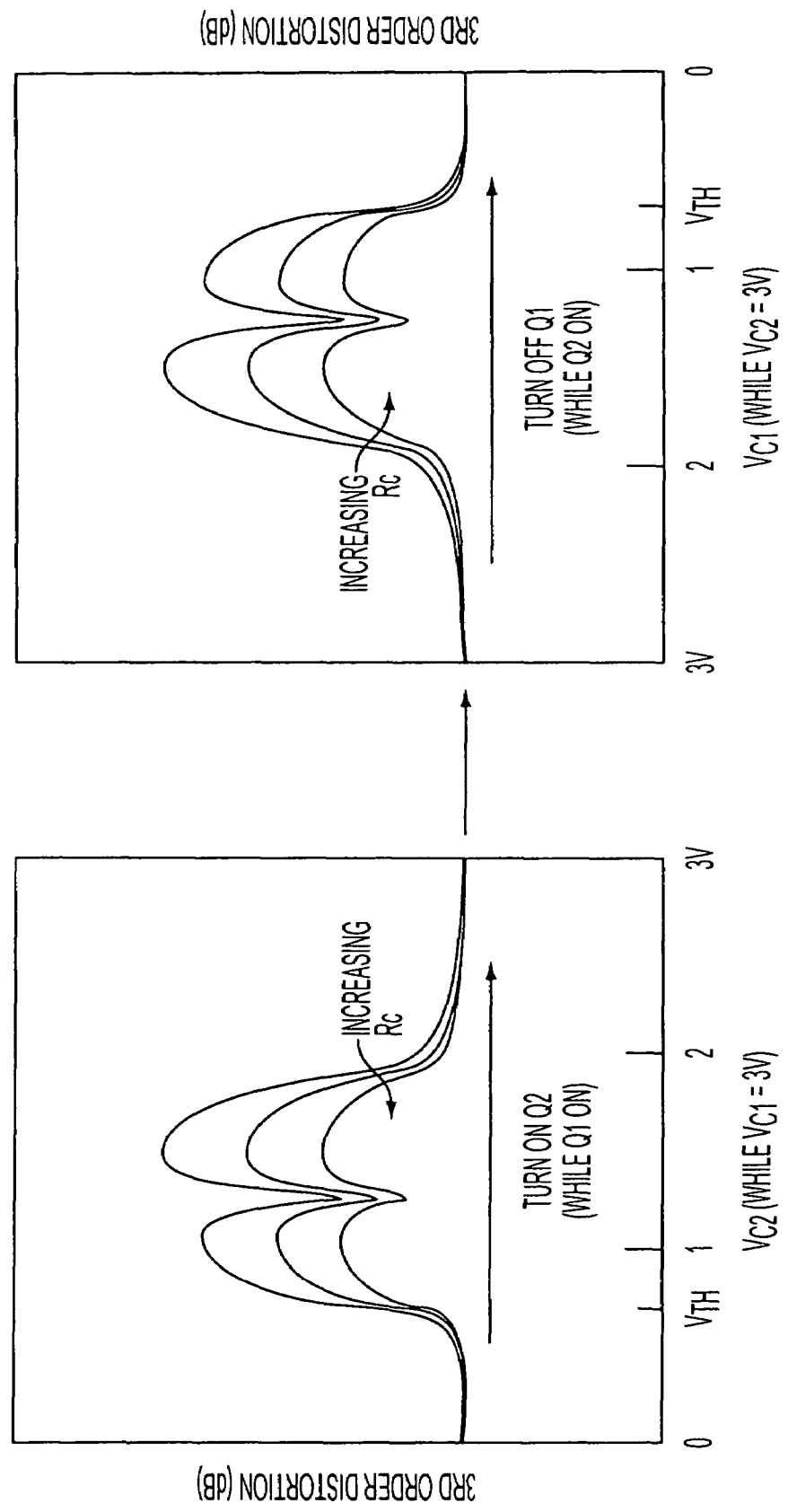
FIG. 3 illustrates an example of $3^{rd}$-order distortion for a two-step transition from one attenuator node to an adjacent attenuator node, according to an embodiment of the present teaching.

There are some positive effect as to distortion when the value of $R_c$ is increased. FIGS. 3(*a*) and 3(*b*) illustrate the benefit of a larger value of $R_c$ in the context of a two-step transition. The top curve in FIG. 3(*a*) depicts the $3^{rd}$ order distortion, either IM3 or HD3, to the amplifier, e.g., 240, when a low $R_c$ value for Q2 is used during a two-step transition in which Q1 is on and Q2 transits from off to on state. As can be seen, a low value of $R_c$ connected to the gate of Q2 effectively pins the gate voltage so that the gate of Q2 is unable to respond to the average signal coupling through the series RC branches connected from gate to drain and from gate to source. When the $R_c$ value associated with Q2 is increased above the resistance in the series RC branch connected with Q2, the gate potential begins to float with the AC cycle at the drain/source of Q2, and the peak $3^{rd}$-order distortion is reduced about 20-30 dB. A point of diminishing returns is reached when $R_c$ is greater than approximately 50 times the resistance in the series RC branch. The curves in FIG. 3(a) depict a similar behavior change related to the distortion generated during the Q1 turn-OFF and Q2 ON portion of the two-step transition. Similarly, a substantial reduction of distortion product is observed when the value of $R_c$ is increased. Thus, increasing the value of $R_c$ makes it possible to introduce a positive effect on distortion in both steps of a two-step transition.

A complete set of transitions as applied to the exemplary 5-stage attenuator ladder (250) in a consecutive manner from attenuator node #1 through #5 is illustrated in FIG. 4. The basic transition from attenuator node #1 to node #2, as described herein, is repeated to each and every pair of adjacent nodes to create a desired continuous gain control response over a range of 16 dB. As can be seen, the top two curves in FIG. 4 illustrate the transition between attenuator node #1 and node #2. During that period, Stages #1 and #2 are active (one is ON and one is transitioning) while stages #3, #4, and #5 are inactive (neither ON nor transitioning). However, although stage #3 is inactive, it is considered to be adjacent to an active stage. This special state is important and is a distinction that will be used in discussions with reference to FIG. 5.

Figure 5:
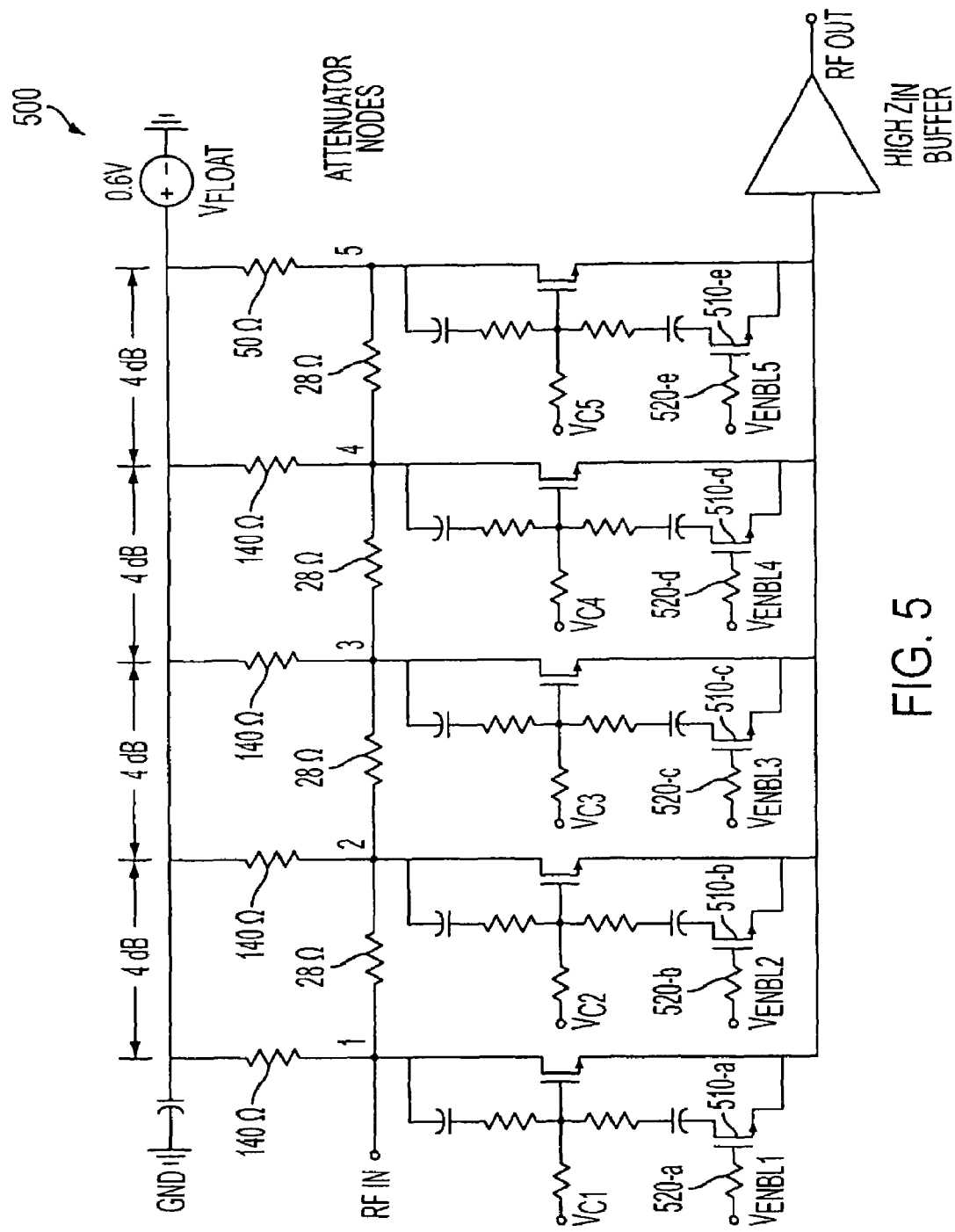
FIG. 5 depicts an exemplary VGA circuitry with an RC enable circuitry therein capable of decoupling an RC networks, according to an embodiment of the present teaching.

As discussed herein, the loading effect of the series RC branches to the attenuator ladder is usually not significant. But the loading to the input of the high $Z_{IN}$ buffer or amplifier 240 can be significant at higher frequencies, especially for attenuator ladders with a large number of tapped nodes. To address the issue of loading effect to the amplifier input, a circuit can be added to the VGA circuit disclosed to effectively enable or decouple the RC circuit in each attenuator node whenever it is appropriate. FIG. 5 depicts an exemplary embodiment of an VGA circuit 500 incorporating an RC enabling circuit that is capable of decoupling an RC circuit associated with an attenuator node that is neither active nor adjacent to an active node. In FIG. 5, for each attenuator node, an RC enabling circuit comprising a transistor, e.g., 510-a, and a resistor, e.g., 520-a. Other attenuator nodes may similarly incorporate such a circuit (e.g., 510-b and 520-b for node #2, 510-c and 520-c for node #3, 510-d and 520-d for node #4, and 510-e and 520-e for node #5). In the exemplary construction, the transistor of the RC enabling circuit has its source serially connected to the capacitor in the bottom RC branch and its drain coupled to the input to the amplifier 240 (see FIG. 2). The gate of the transistor 510-a is connected to the resistor 520-a of the RC enabling circuit, which is connected to a control signal to be used to control the decoupling. The RC enabling circuits associated with other nodes along the attenuator ladder can be similarly constructed.

In operation, when an attenuator node is neither active nor adjacent to an active node, this attenuator is not involved in an ongoing attenuator transition or any imminent attenuator transition. In this case, the attenuator node can be effectively removed from the VGA operational circuit using a low voltage on the control signal connected to the resistor, e.g., 520-a or $V_{ENBL}$ as shown in FIG. 5. This operates to effectively decouple the RC circuit from the input to the amplifier 240 so as to reduce the loading effect from those inactive stages to the high $Z_{IN}$ node and improves the high frequency performance of the underlying VGA. The benefit of this embellishment is more visible as the number of attenuator stages increases. Furthermore, the entire attenuator ladder and NMOS taps are floated to a voltage of approximately 0.6V to double the allowable signal amplitude at the attenuator node before the NMOS drain-to-substrate diodes clip the signal.

Additionally, the series RC network as depicted in FIG. 2 provides an alternative parallel path for signal conduction that may leak unintended signals around the tapping FETs. This is especially so when the attenuator ladder is substantially long. When there is a attenuator ladder of a substantial length, and the gain control is set to tap farther down the attenuator ladder (e.g. Q4, Q5), such a long attenuator ladder may produce a large ratio between a signal near the early NMOS devices and the intended tapped signal farther down the ladder. For example, if a similarly designed attenuator ladder contains 11 nodes with the first 10 NMOS tap devices OFF and the last NMOS tap device ON, then there will be a 40 dB ratio of the signal at Q1 compared to the tapped signal at Q11. Thus, a very small fraction of leakage signal through the Q1 transistor can substantially contaminate the desired tapped signal at Q11.

Figure 6:
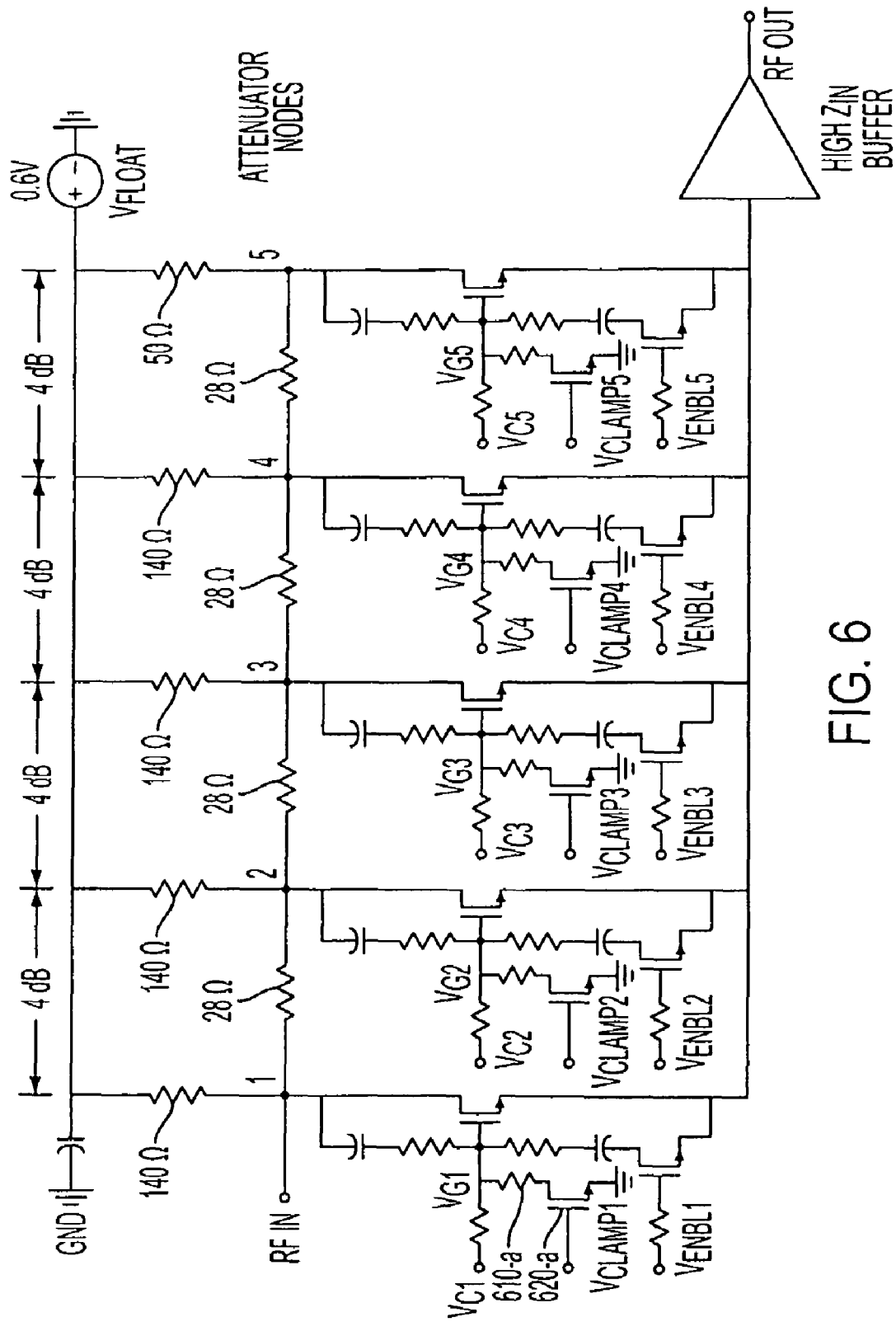
FIG. 6 depicts an exemplary VGA circuitry having a gate clamp circuitry therein capable of providing an improved gate grounding of an attenuator node, according to an embodiment of the present teaching.

To reduce the negative effect of such leakage, a gate clamping circuit may be incorporated in the VGA circuit 200 or 500. FIG. 6 depicts an exemplary construct of such a gate clamp circuit incorporated in a VGA circuit 600 to provide improved gate grounding for NMOS devices positioned at early stages of an attenuator ladder (e.g., Q1 and Q2), according to an embodiment of the present teaching. The gate clamping circuit as depicted in FIG. 6 comprises a resistor 610-a and a transistor 620-a. On one end, resistor 610-a connects to the gate terminal of a tap transistor in the same attenuator node and, on the other end, connects to the source of transistor 620-a. A control signal $V_{CLAMP}$ is connected to the gate of transistor 620-a to control the state of the transistor 620-a. The drain of the transistor 620-a is grounded. The gate clamping circuits incorporated in other attenuator nodes in this exemplary VGA circuit are similarly constructed.

Such a gate clamping circuit serves to clamp OFF an early NMOS device, such as Q1 or Q2, using a suitable low $V_{CLAMP}$ signal. In operation, this grounds the gates of transistors so that it prevents large signals from leaking through inactive nodes of early stages while the nodes from later stages are active. In this way, it improves the large signal amplitude performance. The low voltage used to ground the transistor is usually supplied after the attenuator node is in an inactive state and is not adjacent to an active node. The benefit of this embellishment can be more appreciated as the attenuator range increases.

Figure 7A:
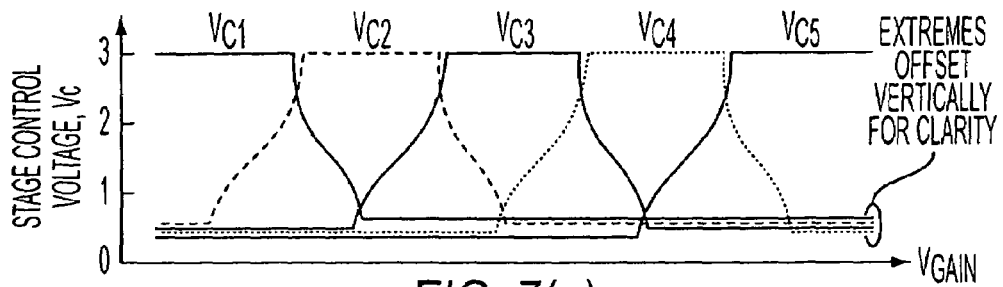
FIG. 7 illustrates exemplary control voltages for a 5-node exemplary attenuator ladder, according to an embodiment of the present teaching.
Figure 7B:
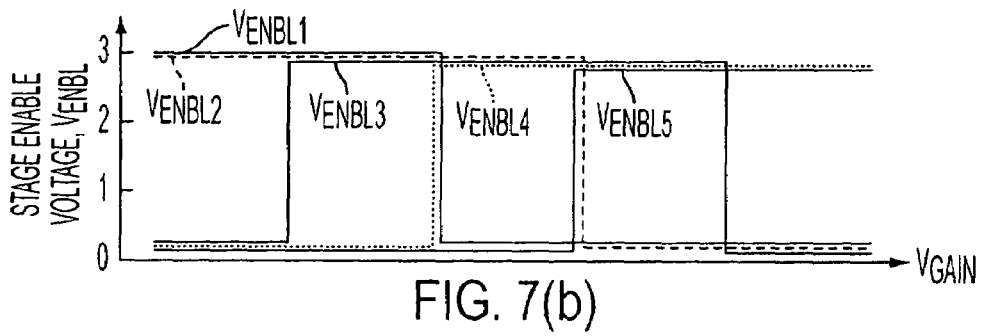
Figure 7C:
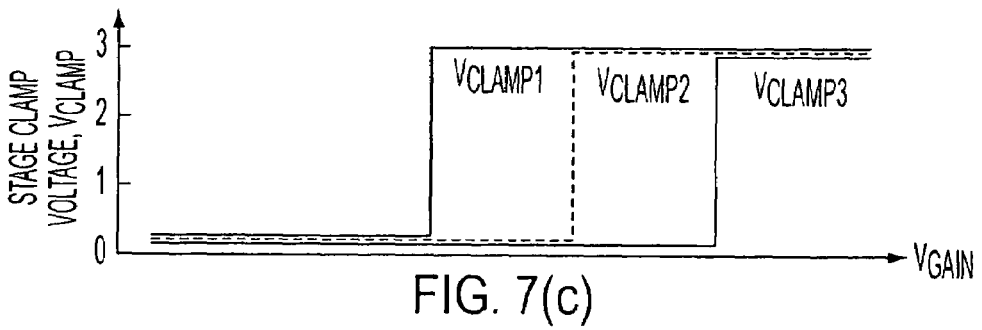
Figure 7D:
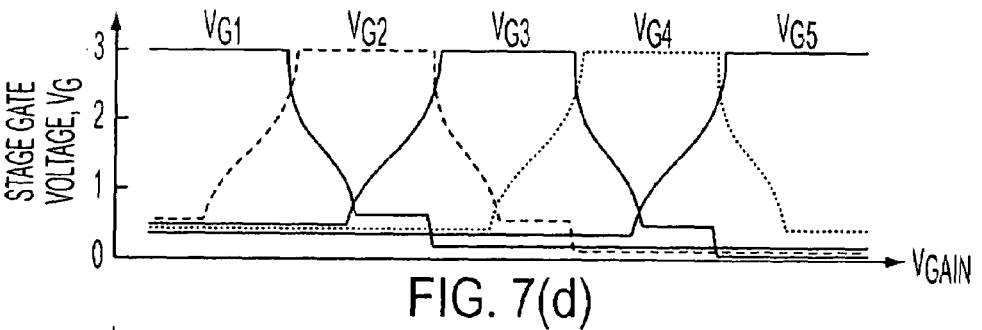
Figure 7E:
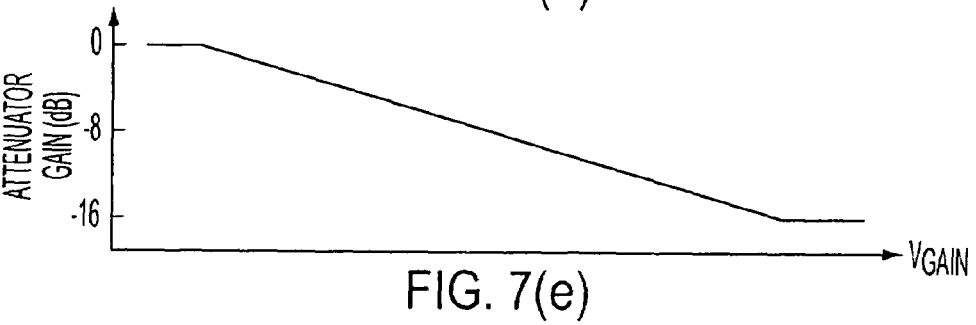

FIGS. 7(a)-7(e) illustrates various control voltages used in the exemplary VGA circuit 600 employing a 5-node attenuator ladder, as shown in FIG. 6. There are a total of five plots, each of which shows the curves of one or more control signals. In those plots, the X-axis represents the input analog gain control signal, $V_{GAIN}$. The Y-axes in FIGS. 7(a)-7(c) represent the control voltage levels of exemplary control signals $V_c$, $V_{ENBL}$, and $V_{CLAMP}$, respectively. The Y-axis in FIG. 7(d) represents the voltage level of the desired DC gate voltage $V_G$ at the gate terminal of the five illustrative NMOS tap transistors, as a result of the compound effect of the three sets of control signals illustrated in FIGS. 7(a)-7(c). The plot in FIG. 7(e) illustrates the gain consequently obtained from the attenuator as a result of the operations under the control of the control voltages shown in FIGS. 7(a)-7(c). In FIGS. 7(a)-7(d), the overlaying traces are offset vertically for clarity.

In FIG. 7(a), the stage control voltages, $V_{C1}$, $V_{C2}$, $V_{C3}$, $V_{C4}$, $V_{C5}$, are seen to form a set of overlapping, shaped trapezoids with the tops of the curves near the supply voltage and the bottoms of the curves near the level of float voltage, $V_{FLOAT}$, around 0.6V. The shaped sides approximately match the non-linear $R_{Ds}(V_G)$ characteristic of NMOS tap devices so as to help produce the linear Gain($V_{GAIN}$) relation shown in FIG. 7(e). These curves can be generated using any number of standard analog circuit methods. For example, see Kachare, "Low-Voltage Fully Programmable CMOS Triangular/Trapezoidal Function Generator Circuit," *IEEE J. Solid-State Circuits*, vol. 52, no. 10, December 2005 for a detailed description of such a particular method and several references to other methods.

In FIG. 7(b), the stage enable control voltages, $V_{ENBL1}$, $V_{ENBL2}$, $V_{ENBL3}$, $V_{ENBL4}$, $V_{ENBL5}$, may be generated based on the stage control voltages with appropriate logic circuits. For example, $V_{ENBL3}$ can be treated as a logical AND function of $V_{C2}$, $V_{C3}$, and $V_{C4}$. Other $V_{ENBL}$ signals can be generated in a similar way. Likewise, the stage clamp voltages, $V_{CLAMP}$, in FIG. 7(c) can be generated from the corresponding $V_{ENBL}$ signals with the appropriate logic circuits. The net effect of these control signals is presented in FIG. 7(d) as the stage gate voltages, $V_G$. The DC $V_G$ voltages, as illustrated in FIG. 7(d), follow the $V_C$ control voltages except where a corresponding $V_{CLAMP}$ signal is high. When this occurs, since the $V_G$ signal is pulled down near 0V to further clamp OFF the early tap transistors. Since the AC $V_G$ voltage of various NMOS tap transistors are permitted to float to an average Source/Drain voltage, the VGA circuitry as illustrated in the exemplary embodiments is capable of suppressing distortion when the corresponding $V_{ENBL}$ signal is high.

Figure 8:
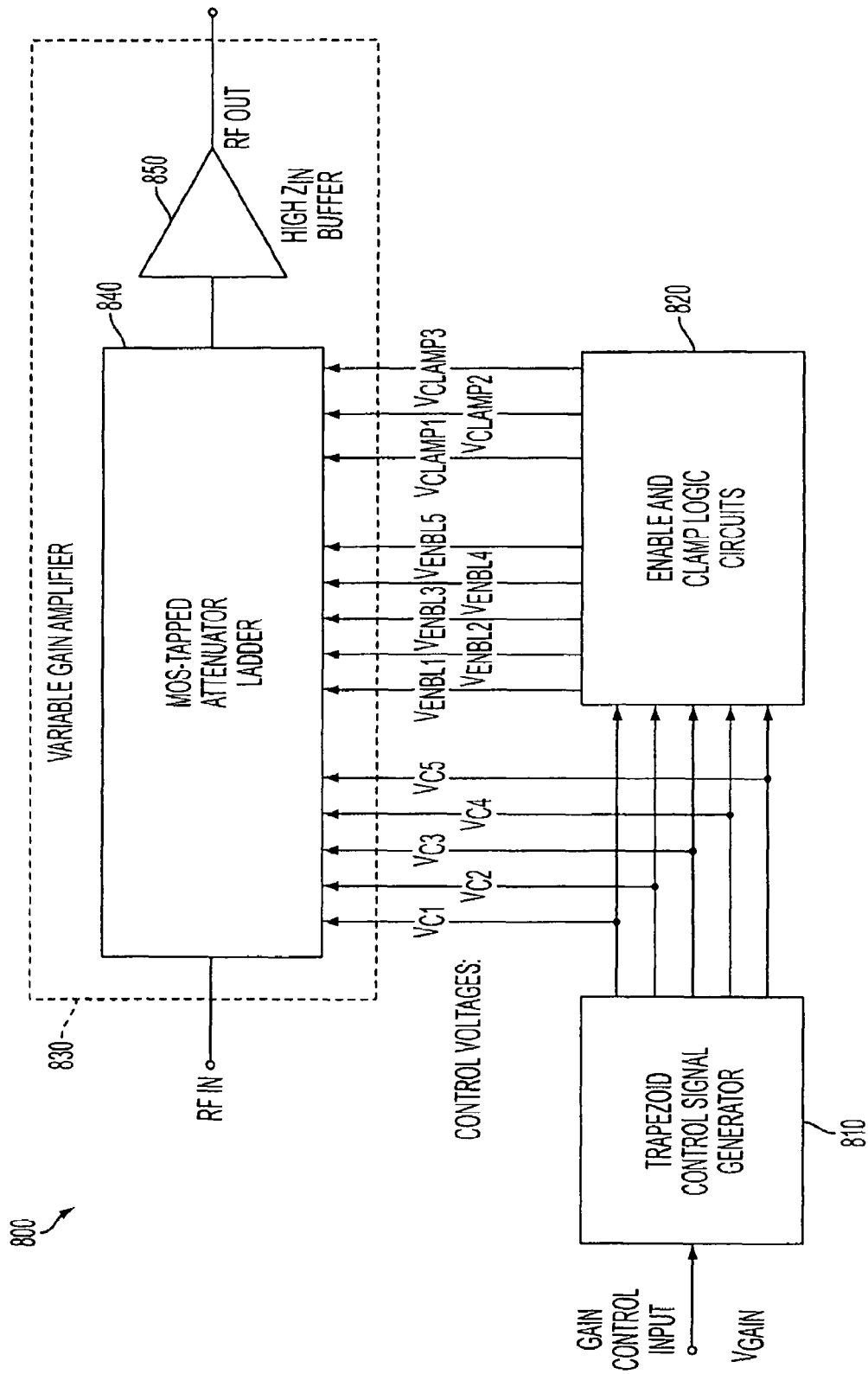
FIG. 8 depicts a high level block diagram of an exemplary system in which various control voltages are generated and fed to a variable-gain amplifier, according to an embodiment of the present teaching.

FIG. 8 depicts an exemplary circuit 800 incorporating a VGA circuit and circuitries employed to supply control signals to the VGA circuit, according to an embodiment of the present teaching. In this illustrated embodiment, the exemplary circuit 800 comprises a VGA 830, a trapezoid control signal generator 810, and a enable and clamping logic circuit 820. The VGA 830 is constructed in accordance with the present teaching, comprising a MOS-tapped 840 and an amplifier 850. The VGA 830 takes an RF IN as an input and generates an RF OUT as output. The MOS-tapped attenuator ladder 840 takes various control signals as inputs and produces a coupled output that is fed to the amplifier as input. To generate various control signals, the trapezoid control signal generator 810 takes a gain control input, $V_{GAIN}$, as input and generates stage control voltages, $V_{C1}$, $V_{C2}$, $V_{C3}$, $V_{C4}$, $V_{C5}$, as outputs to the MOS-tapped attenuator ladder, as described herein. These stage control voltages are also used as inputs to the enable and clamping logic circuits 820, which generates control signals $V_{ENBL1}$, $V_{ENBL2}$, $V_{ENBL3}$, $V_{ENBL4}$, $V_{ENBL5}$, and clamping control signals $V_{CLAMP1}$, $V_{CLAMP2}$, and $V_{CLAMP3}$ as outputs to the MOS-tapped attenuator ladder 840.

Figure 9:
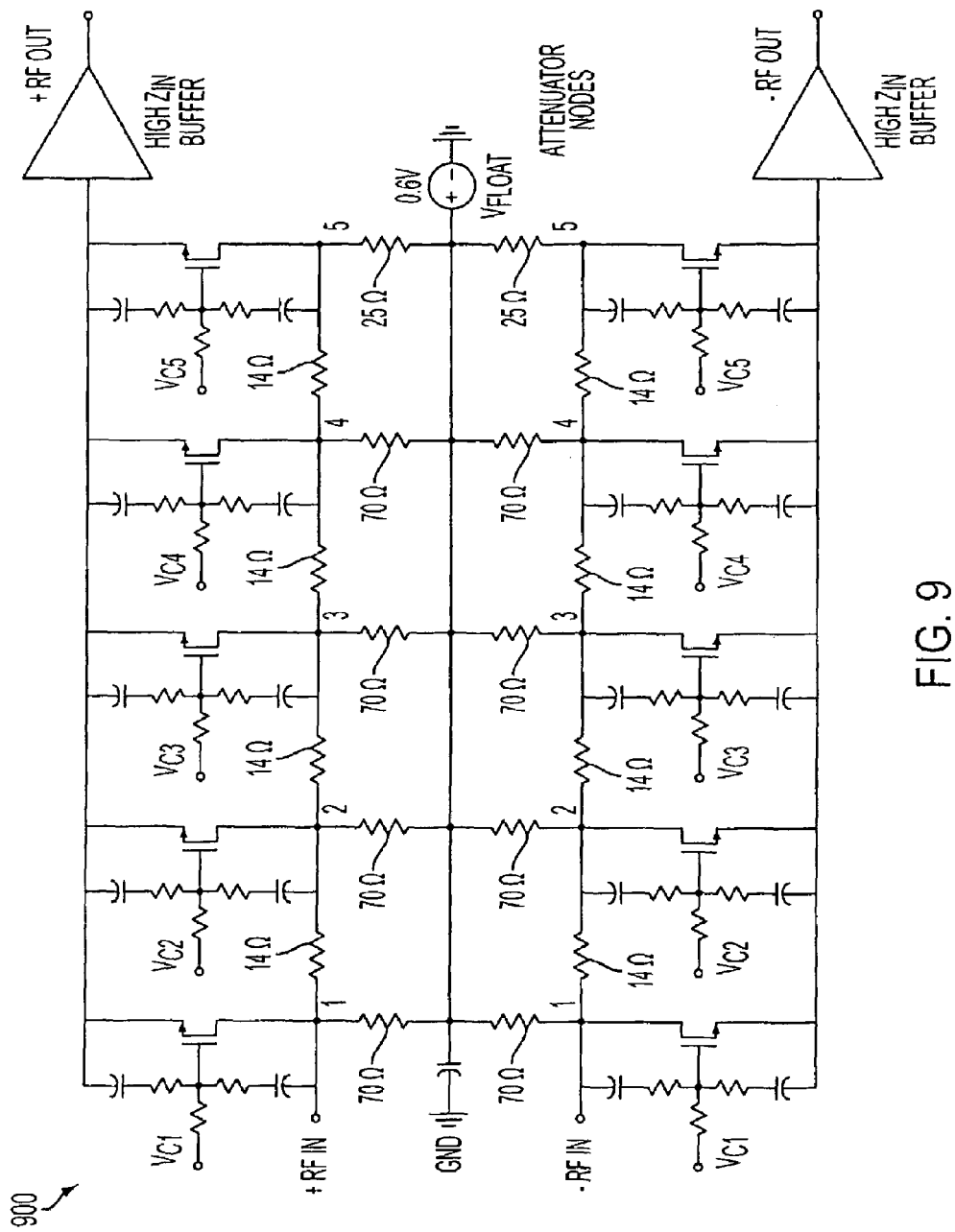
FIG. 9 depicts an exemplary differential VGA circuit, according to an embodiment of the present teaching.

The exemplary embodiments depicted in FIGS. 1-7 are ground-referenced, single-ended circuits with one input terminal and one output terminal. Modern analog circuits often use differential circuits to suppress $2^{nd}$-order distortion and improve noise immunity. All the exemplary embodiments described herein can be transformed into a differential circuit topology. As an illustration, the VGA circuitry 200 can be transformed into a differential VGA circuit 900 as depicted in FIG. 9. The attenuator ladder, NMOS taps, and buffer amplifiers are all duplicated and mirror imaged with respect to a center line of symmetry to form this illustrative differential circuit. Specifically, in FIG. 9, the center line of symmetry is the ground. The top circuit with respect to the ground constitutes the positive half of the differential VGA circuit 900 and the bottom circuit with respect to the ground is the negative half of the differential VGA circuit 900. However, the associated control signals may or may not be duplicated. In the illustrated differential VGA circuit, the same control signals are applied to both the positive half and the negative half of the circuit.

Differential VGA circuits based on the illustrative embodiments as shown in FIG. 5 and FIG. 6 can be similarly constructed. Such transformations are common used in the field of analog circuit design. Those skilled in the art will be readily able to construct and make various modifications, as may be required by different applications, to the embodiments of the present teaching as described herein without departing from the spirit and scope of the invention.

While the inventions have been described with reference to the certain illustrated embodiments, the words that have been used herein are words of description, rather than words of limitation. Changes may be made, within the purview of the appended claims, without departing from the scope and spirit of the invention in its aspects. Although the inventions have been described herein with reference to particular structures, acts, and materials, the invention is not to be limited to the particulars disclosed, but rather can be embodied in a wide variety of forms, some of which may be quite different from those of the disclosed embodiments, and extends to all equivalent structures, acts, and, materials, such as are within the scope of the appended claims.

I claim:

1. A variable-gain amplifier (VGA), comprising:
   a plurality of attenuator nodes serially connected via a first set of resistors between adjacent attenuator nodes to form an attenuator ladder and coupled to an AC input of the variable-gain amplifier, wherein each of the attenuator nodes comprises a transistor and an RC circuitry that couples a drain, a gate, and a source terminals of the transistor to a control signal for the attenuator node; and
   an amplifier having an output produced based on an input to the amplifier connected to a plurality of coupled terminals, each of which is respectively from one of the plurality of attenuator nodes, wherein
   the RC circuitry for each attenuator node is configured to pass a control signal to the gate terminal of the transistor of the attenuator node in accordance with a first time scale and permit the gate terminal to float in accordance with a second time scale so as to yield a reduction of distortion contributed by the transistor while the transistor is transitioning between on and off states.

2. The VGA of claim 1, wherein the first time scale is greater than 10 AC cycles.

3. The VGA of claim 1, wherein the second time scale is substantially shorter than the first time scale.

4. The VGA of claim 1, wherein the second time scale is substantially one AC cycle.

5. The VGA according to claim 1, wherein the distortion includes at least one of intermodulation distortion and harmonic distortion.

6. The VGA of claim 1, wherein the drain of the transistor in each attenuator node is connected to at least one of the first set of resistors, which are coupled to the AC input, and a ground via a second resistor, the source of the transistor is coupled, together with sources of transistors of other attenuator nodes, to the input of the amplifier.

7. The VGA of claim 1, where the RC circuitry of an attenuator node comprises:
   a first RC branch coupling the gate and the source of the transistor of the attenuator node;
   a second RC branch coupling the gate and drain of the transistor of the attenuator node; and
   a third resistor which passes the control signal to the gate of the transistor of the attenuator node.

8. The VGA of claim 7, wherein the first RC branch comprises a fourth resistor and a first capacitor, the fourth resistor is coupled to the gate of the transistor and serially connected to the first capacitor, which is connected to the source of the transistor.

9. The VGA of claim 7, wherein the second RC branch comprises a fifth resistor and a second capacitor, the fifth resistor is coupled to the gate of the transistor and serially connected to the second capacitor, which is connected to the drain of the transistor.

10. The VGA of claim 7, wherein resistance of the first and second RC branches is selected to minimally load the attenuator ladder and allow the gate to float in accordance with the second time scale.

11. The VGA of claim 7, wherein the third resistor is selected so as to allow sufficient gate floating yet capable of responding quickly to changes in the control signal.

12. The VGA according to claim 1, wherein an attenuator step size between adjacent nodes is below 6 dB.

13. The VGA of claim 1, wherein continuous gain control is realized via a continuous two-step transition between every two adjacent attenuator nodes along the attenuator ladder, where in each two-step transition, only two adjacent attenuator nodes are activated using the control signals supplied to the two attenuator nodes and at least one of the activated attenuator nodes is on during each two-step transition period.

14. A variable-gain amplifier (VGA), comprising:
a plurality of attenuator nodes serially connected via a first set of resistors between adjacent attenuator nodes to form an attenuator ladder and coupled to an AC input of the variable-gain amplifier, wherein each of the attenuator nodes comprises a first transistor, an RC circuitry that couples drain, gate, and source terminals of the first transistor to a control signal for the attenuator node, and an RC enabling circuitry; and
an amplifier having an output produced based on an input of the amplifier connected to a plurality of coupled terminals, each of which is respectively from one of the plurality of attenuator nodes, wherein
the RC circuitry for each attenuator node passes a first control signal to the gate terminal of the first transistor of the attenuator node in accordance with a first time scale and permits the gate terminal to float in accordance with a second time scale so as to yield a reduction of distortion contributed by the first transistor while the first transistor is transitioning between on and off states, and
the RC enabling circuitry of each attenuator node is capable of decoupling the RC circuitry when operating so as to minimize loading to the input to the amplifier.

15. The VGA of claim 14, wherein the source of the first transistor in each attenuator node is connected to at least one of the first set of resistors, which are coupled to the AC input, and a ground via a second resistor, the drain of the first transistor is coupled to the input of the amplifier.

16. The VGA of claim 14, where the RC circuitry of an attenuator node comprises:
a first RC branch coupling the gate and the source of the first transistor of the attenuator node and having a third resistor and a first capacitor, the third resistor is coupled to the gate of the first transistor and serially connected to the first capacitor, which is connected to the source of the first transistor;
a second RC branch coupling the gate and drain of the first transistor of the attenuator node and having a fourth resistor and a second capacitor, the fourth resistor is coupled to the gate of the first transistor and serially connected to the second capacitor, which is connected to the RC decoupling circuitry; and
a fifth resistor which passes the first control signal to the gate of the first transistor of the attenuator node.

17. The VGA of claim 16, wherein the RC enabling circuitry comprises a second transistor and a sixth resistor, where the source of the second transistor is serially connected to the second capacitor, the drain of the second transistor is connected to the input of the amplifier, and the gate of the second transistor is serially coupled to a second control signal via the sixth resistor.

18. The VGA of claim 17, wherein continuous gain control for the VGA is realized via a continuous two-step transition between every two adjacent attenuator nodes along the attenuator ladder, where in each two-step transition, only two adjacent attenuator nodes are activated via the first control signals supplied to the two attenuator nodes, respectively, and at least one of the two activated attenuator nodes is on during each two-step transition period.

19. The VGA of claim 18, wherein the second control signal turns on the second transistor permitting the RC circuitry to connect to the input of the amplifier when the corresponding attenuator node is active or adjacent to an active attenuator node, and turns off the second transistor when the corresponding attenuator node is not active and not adjacent to an active attenuator so as to decouple the RC circuitry from the input to the amplifier.

20. A variable-gain amplifier (VGA), comprising:
a plurality of attenuator nodes serially connected via a first set of resistors between adjacent attenuator nodes to form an attenuator ladder and coupled to an AC input of the variable-gain amplifier, wherein each of the attenuator nodes comprises a first transistor and an RC circuitry that couples a drain, a gate, and a source terminals of the first transistor to a control signal for the attenuator node; and
an amplifier having an output produced based on an input of the amplifier connected to a plurality of coupled terminals, each of which is respectively from one of the plurality of attenuator nodes, wherein
the RC circuitry for each attenuator node passes a first control signal to the gate terminal of the first transistor of the attenuator node in accordance with a first time scale and permit the gate terminal to float in accordance with a second time scale so as to yield a reduction of distortion contributed by the first transistor while the first transistor is transitioning between on and off states, and
at least some attenuator nodes at early stage of the attenuator ladder include a gate clamping circuitry therein, each gate clamping circuitry having three terminals connecting to the gate of the first transistor, a second control signal, and a ground, respectively.

21. The VGA of claim 20, wherein the source of the first transistor in each attenuator node is connected to at least one of the first set of resistors, which are coupled to the AC input, and the ground via a second resistor, the drain of the first transistor is coupled to the input of the amplifier.

22. The VGA of claim 20, where the RC circuitry of an attenuator node comprises:
a first RC branch coupling the gate and the source of the first transistor of the attenuator node and having a third resistor and a first capacitor, the third resistor is coupled to the gate of the first transistor and serially connected to the first capacitor, which is connected to the source of the first transistor;
a second RC branch coupling the gate and drain of the first transistor of the attenuator node and having a fourth resistor and a second capacitor, the fourth resistor is coupled to the gate of the first transistor and serially connected to the second capacitor, which is connected to the input of the amplifier; and a fifth resistor which passes the first (DC) control signal to the gate of the first transistor of the attenuator node.

23. The VGA of claim 20, wherein the gate clamping circuitry comprises a second transistor and a sixth resistor, where a source of the second transistor is coupled to the gate of the first transistor via the sixth resistor, a drain of the second transistor is connected to the ground, and the gate of the second transistor is connected to the second control signal.

24. The VGA of claim 20, wherein continuous gain control for the VGA is realized via a continuous two-step transition between every two adjacent attenuator nodes along the attenuator ladder, where in each two-step transition, only two adjacent attenuator nodes are activated via the first control signals supplied to the two attenuator nodes, respectively, and at least one of the two activated attenuator nodes is on during each two-step transition period.

25. The VGA of claim 24, wherein the second control signal supplied to a gate clamping circuitry corresponding to an attenuator node turns on the second transistor to prevent leak from the corresponding attenuator node when the corresponding attenuator node is not active or not adjacent to an active attenuator node.

26. A differential variable-gain amplifier (DVGA), comprising:

a first set of attenuator nodes serially connected via a first set of resistors between adjacent first set of attenuator nodes to form a first attenuator ladder and coupled to a first AC input of the DVGA, a first amplifier having a first output produced based on an input of the first amplifier connected to a first plurality of coupled terminals, each of which is respectively from one of the first set of attenuator nodes, a second set of attenuator nodes serially connected via a second set of resistors between adjacent second set of attenuator nodes to form a second attenuator ladder and coupled to a second AC input of the DVGA, a second amplifier having a second output produced based on an input of the second amplifier connected to a second plurality of coupled terminals, each of which is respectively from one of the second set of attenuator nodes, wherein each of the first and second sets of attenuator nodes comprises a transistor and an RC circuitry that couples a drain, a gate, and a source terminals of the transistor to a control signal for the attenuator node, and the RC circuitry for each attenuator node is configured to pass a control signal to the gate terminal of the transistor of the attenuator node in accordance with a first time scale and permit the gate terminal to float in accordance with a second time scale so as to yield a reduction of distortion contributed by the transistor while the transistor is transitioning between on and off states.

27. The VGA of claim 26, wherein the source of the transistor in each of the first set of attenuator node is connected to at least one of the first set of resistors, which are coupled to the first AC input, and a ground via a third resistor, the drain of the transistor in each of the first set of attenuator nodes is coupled to the input of the first amplifier.

28. The VGA of claim 27, wherein the source of the transistor in each of the second set of attenuator node is connected to at least one of the second set of resistors, which are coupled to the second AC input, and the ground via a fourth resistor, the drain of the transistor in each of the second set of attenuator nodes is coupled to the input of the second amplifier.

* * * * *

UNITED STATES PATENT AND TRADEMARK OFFICE
CERTIFICATE OF CORRECTION

PATENT NO.         : 7,714,658 B1                                     Page 1 of 1
APPLICATION NO.    : 12/276552
DATED              : May 11, 2010
INVENTOR(S)        : Walter A. Strifler It is certified that error appears in the above-identified patent and that said Letters Patent is hereby corrected as shown below:

Title Page, Item (12) "Striflier" should read -- Strifler --.
    Title Page, Item (75) Inventor's Name should read -- Walter Andrew Strifler -- rather than Walter Andrew Striflier.

Signed and Sealed this
Twenty-fourth Day of June, 2014

Michelle K. Lee
*Deputy Director of the United States Patent and Trademark Office*